United States Patent
Valentine

(10) Patent No.: US 9,307,495 B2
(45) Date of Patent: Apr. 5, 2016

(54) MONITORING A BATTERY IN A PORTABLE ELECTRONIC DEVICE

(75) Inventor: Val Valentine, Castro Valley, CA (US)

(73) Assignee: Apple Inc., Cupertino, CA (US)

( * ) Notice: Subject to any disclaimer, the term of this patent is extended or adjusted under 35 U.S.C. 154(b) by 362 days.

(21) Appl. No.: 13/363,213

(22) Filed: Jan. 31, 2012

(65) Prior Publication Data

US 2013/0063097 A1 Mar. 14, 2013

Related U.S. Application Data

(60) Provisional application No. 61/533,717, filed on Sep. 12, 2011.

(51) Int. Cl.
| | |
|---|---|
| *H02J 7/00* | (2006.01) |
| *G01N 27/416* | (2006.01) |
| *H04W 52/02* | (2009.01) |
| *G06F 1/32* | (2006.01) |
| *G01R 31/36* | (2006.01) |

(52) U.S. Cl.
CPC ........... *H04W 52/027* (2013.01); *G01R 31/362* (2013.01); *G01R 31/3606* (2013.01); *G01R 31/3682* (2013.01); *G06F 1/3212* (2013.01); *G06F 1/3287* (2013.01); *H04W 52/028* (2013.01); *Y02B 60/1282* (2013.01); *Y02B 60/1292* (2013.01); *Y02B 60/50* (2013.01)

(58) Field of Classification Search
USPC .......................................... 320/136; 324/427
See application file for complete search history.

(56) References Cited

U.S. PATENT DOCUMENTS

| | | | | |
|---|---|---|---|---|
| 5,818,333 | A * | 10/1998 | Yaffe et al. | 340/455 |
| 8,450,978 | B2 * | 5/2013 | Barsukov et al. | 320/136 |
| 2002/0028701 | A1 | 3/2002 | Satoh | |
| 2004/0130556 | A1* | 7/2004 | Nokiyama | 345/617 |
| 2005/0017685 | A1* | 1/2005 | Rees et al. | 320/132 |
| 2005/0237024 | A1* | 10/2005 | Hogari et al. | 320/128 |
| 2006/0005058 | A1* | 1/2006 | Chen et al. | 713/320 |
| 2007/0201703 | A1 | 8/2007 | Dorogusker | |
| 2010/0088051 | A1* | 4/2010 | Iwai et al. | 702/63 |
| 2010/0245102 | A1* | 9/2010 | Yokoi | 340/636.16 |
| 2011/0238250 | A1* | 9/2011 | Takao | 701/22 |
| 2012/0038322 | A1* | 2/2012 | Moorhead et al. | 320/136 |
| 2012/0054790 | A1* | 3/2012 | Kim | 725/30 |
| 2012/0153960 | A1* | 6/2012 | Wortham et al. | 324/426 |

FOREIGN PATENT DOCUMENTS

| | | | |
|---|---|---|---|
| EP | 1098202 A2 | 5/2001 | |
| JP | 10082844 A | 3/1998 | |

* cited by examiner

*Primary Examiner* — Richard Isla Rodas
*Assistant Examiner* — David V Henze-Gongola
(74) *Attorney, Agent, or Firm* — Blank Rome LLP

(57) ABSTRACT

The disclosed embodiments provide a system that monitors a battery in a portable electronic device. During operation, the system monitors a state of charge of the battery while the battery is powering the portable electronic device. Next, when the state of charge of the battery reaches a predetermined reserve capacity, the system monitors a voltage of the battery. Then, when the monitored voltage of the battery reaches a predetermined termination voltage, the system puts the portable electronic device into a low power usage state.

18 Claims, 2 Drawing Sheets

MONITORING A BATTERY IN A PORTABLE ELECTRONIC DEVICE

RELATED APPLICATION

This application hereby claims priority under 35 U.S.C. §119 to U.S. Provisional Application No. 61/533,717, entitled "Remaining State of Charge Indicator," by Val Valentine, filed 12 Sep. 2011.

BACKGROUND

1. Field

The present embodiments relate to techniques for monitoring a battery. More specifically, the present embodiments relate to techniques for monitoring a battery in a portable electronic device.

2. Related Art

Typically, the state of charge of a battery in a portable electronic device is monitored by a battery gas gauge. The state of charge is then often displayed to the user of the portable electronic device so that, among other things, the user can be made aware of the remaining battery life and can adjust their usage accordingly. The battery state of charge is also used by the portable electronic device to ensure that the device can shut down in an orderly fashion before the battery is no longer capable of powering the device.

However, battery gas gauges typically have some level of inaccuracy when monitoring the state of charge of a battery. Therefore, portable electronic devices usually shut down when the battery gas gauge determines that the state of charge of the battery has reached a predetermined reserve capacity. The predetermined reserve capacity is set to be larger than the expected inaccuracies in the battery gas gauge so that there is always enough remaining state of charge in the battery to shut down the device in an orderly fashion. However, as a result of this, there is often still some usable charge left in the battery after the device has shut down. This remaining state of charge is not available to the user of the device and hence, in effect, reduces the total capacity of the battery which is available to the user.

Hence, use of battery-powered portable electronic devices may be facilitated by monitoring a battery in a portable electronic device to allow use of the reserve state of charge.

SUMMARY

The disclosed embodiments provide a system that monitors a battery in a portable electronic device. During operation, the system monitors a state of charge of the battery while the battery is powering the portable electronic device. Next, when the state of charge of the battery reaches a predetermined reserve capacity, the system monitors a voltage of the battery. Then, when the monitored voltage of the battery reaches a predetermined termination voltage, the system puts the portable electronic device into a low power usage state.

In some embodiments, monitoring the state of charge of the battery involves using a battery gas gauge to monitor the state of charge of the battery.

In some embodiments, when the state of charge of the battery reaches the predetermined reserve capacity, the method additionally comprises displaying a minimal state of charge value to a user of the portable electronic device.

In some embodiments, the minimal state of charge value is a 1% state of charge.

In some embodiments, when the monitored voltage of the battery has a predetermined number of transient dips equal to or below the predetermined termination voltage, the system reduces the power drawn by the portable electronic device from the battery.

In some embodiments, reducing the power drawn by the portable electronic device from the battery includes one or more of: reducing the screen brightness, reducing the speaker volume, and shutting down a radio transceiver.

In some embodiments, putting the portable electronic device into a low power usage state includes putting the portable electronic device into a shutdown state.

In some embodiments, the predetermined reserve capacity is between a 2% state of charge of the battery and a 4% state of charge of the battery.

In some embodiments, the portable computing device includes at least one of: a smartphone, a tablet computer, and a laptop computer.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1A:
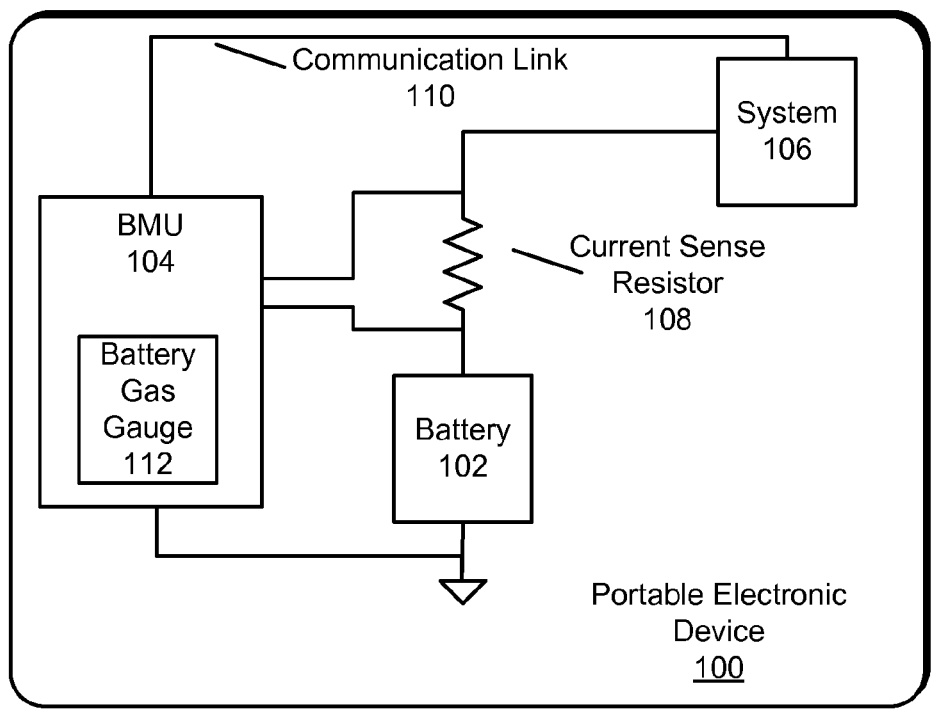
FIG. 1A shows a portable electronic device monitoring a battery in accordance with an embodiment.

FIG. 1A shows a portable electronic device monitoring a battery in accordance with an embodiment. Portable electronic device 100 includes battery 102 which is coupled to battery monitoring unit (BMU) 104 and through current sense resistor 108 to system 106. BMU 104 communicates with system 106 through communication link 110, and BMU 104 includes battery gas gauge 112.

Portable electronic device 100 may be any electronic device that is powered by a battery, including but not limited to a smartphone, a tablet computer, a laptop computer, or any other computing device. Battery 102 can be any type of battery capable of powering a portable electronic device, and can be implemented in any technology. In some embodiments, battery 102 includes more than one separate battery and/or battery cell.

BMU 104 monitors the voltage of battery 102 and the current flowing out of battery 102 through current sense resistor 108. BMU 104 can be implemented on a separate processor from system 106 or on the same processor without departing from the invention. Additionally, in some embodiments, BMU 104 and system 106 may share other resources of portable electronic device 100 such as volatile memory (not shown) or non-volatile memory (not shown). Note that system 106 may represent all of the other functional portions of portable electronic device 100 not otherwise depicted in FIG. 1A.

Battery gas gauge 112 monitors the state of charge of battery 102 and can be any process or mechanism implemented in hardware and/or software that can monitor a state of charge of battery 102. In some embodiments, battery gas gauge 112 uses information including but not limited to information about the voltage of battery 102, the current drawn from battery 102, the battery chemistry and cycling history of battery 102, and performance data based on batteries similar to battery 102. Additionally, battery gas gauge 112 stores a value representing a predetermined reserve capacity for battery 102. The predetermined reserve capacity can be a predetermined value entered by a user or manufacturer of portable electronic device 100, or any other value calculated, entered or otherwise predetermined and used by battery gas gauge 112 as a buffer to account for potential inaccuracies in the monitoring of the state of charge of battery 102 by battery gas gauge 112. In some embodiments, the predetermined reserve capacity is stored elsewhere in portable electronic device 100, such as in BMU 104 or in system 106.

During operation, portable electronic device 100 is powered by battery 102. As power is drawn out of battery 102, battery gas gauge 112 monitors the state of charge of battery 102. BMU 104 communicates to system 106 the state of charge monitored by battery gas gauge 112 minus the predetermined reserve capacity. System 106 displays the monitored state of charge of battery 102 minus the predetermined reserve capacity to a user. In some embodiments, this information is displayed as a percentage of the full state of charge of battery 102 or the full state of charge of battery 102 minus the predetermined reserve capacity, or any other suitable format that can communicate the relative state of charge of battery 102 to a user of portable electronic device 100.

As portable electronic device 100 continues drawing power from battery 102, eventually the state of charge of battery 102 monitored by battery gas gauge 112 will fall until it is equal to or less than the predetermined reserve capacity. When this level is reached, BMU 104 communicates to system 106 through communication link 110 that the state of charge of battery 102 is 1%. Note that BMU 104 could communicate to system 106 a value representing any minimal state of charge of battery 102 without departing from the invention. For example, BMU 104 could communicate to system 106 that the state of charge of battery 102 is the lowest state of charge above 0% that can be displayed to a user of portable electronic device 100.

BMU 104 then monitors the voltage of battery 102 and continues communicating to system 106 through communication line 110 that the state of charge of battery 102 is 1% until the voltage measured from battery 102 by BMU 104 reaches a predetermined termination voltage. Note that BMU 104 may determine that the voltage measured from battery 102 has reached the predetermined termination voltage based on information including but not limited to one or more of the following: the number, duration, or frequency of transient voltage dips that are equal or below the predetermined termination voltage, or a steady-state or persistence voltage measurement equal to or below the predetermined termination voltage.

Additionally, in some embodiments, before BMU 104 has determined that the voltage from battery 102 has reached the predetermined termination voltage, when BMU 104 measures one or more transient voltage dips equal to or below the predetermined termination voltage or some other predetermined threshold voltage, BMU 104 signals system 106 through communication link 110 to reduce the power drawn by one or more resources of portable electronic device 100. For example, after BMU 104 has communicated to system 106 that a predetermined number of transient voltage dips of the voltage from battery 104 are equal to or below the predetermined termination voltage, system 106 may reduce the power drawn from battery 102 through one or more of the following actions: reducing the brightness of a screen, reducing the volume of speakers, or shutting down a wireless communication device such as a radio transceiver.

Furthermore, as BMU 104 measures more transient voltage dips equal to below the predetermined termination voltage that exceed other predetermined thresholds in number, frequency, or duration, BMU 104 may signal system 106 through communication link 110 to take additional actions such as further reducing the screen brightness, or speaker volume, or shutting down one or more other resources of portable electronic device 100. System 106 may also display a message to a user of portable electronic device 100 to indicate the actions that are being taken.

Once BMU 104 has determined that the voltage of battery 102 has reached the predetermined termination voltage, BMU 104 communicates a signal to system 106 through communication link 110 that causes portable electronic device 100 to go into a low power usage state. The low power usage state may include but is not limited to a hibernate state, a shutdown state, or any other state that minimizes or stops further power from being drawn from battery 102. In some embodiments, this signal may include but is not limited to setting a flag that indicates to system 106 that portable electronic device 100 should be shut down.

Note that the predetermined termination voltage can be selected by a manufacturer or user of portable electronic device 100, and may be selected so that the voltage from battery 102 is sufficient to allow portable electronic device 100 to enter a low power usage state that minimizes or stops further power from being drawn from battery 102 in an orderly fashion and without loss of data or other potentially undesirable effects on portable electronic device 100. For example, the termination voltage may be picked to be high enough above the brownout voltage for portable electronic device 100 so that even under high load operating conditions, portable electronic device 100 can shut down in an orderly fashion before the voltage from battery 102 reaches the brownout voltage.

Figure 1B:
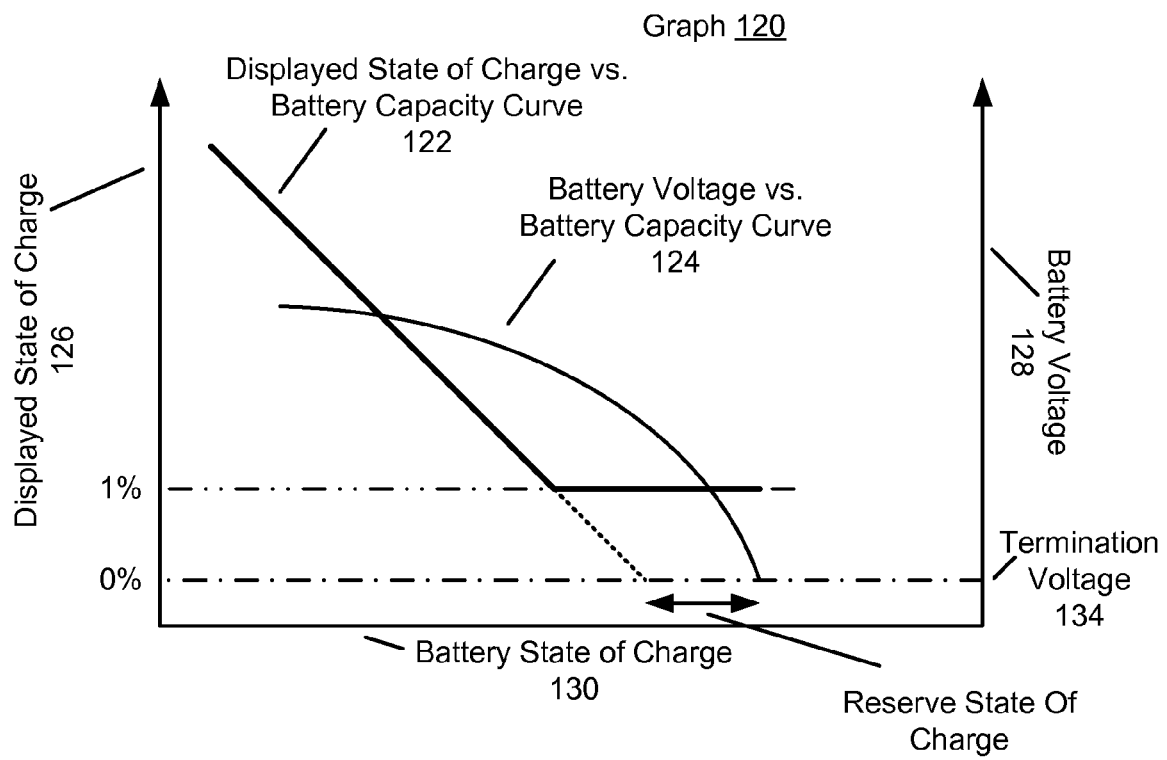
FIG. 1B shows two exemplary battery state of charge graphs overlaid on top of each other to aid in explanation of the operation of an embodiment.

FIG. 1B shows two exemplary battery state of charge graphs overlaid on top of each other to aid in explanation of the operation of an embodiment. Note that in order to help highlight details of the graphs, the axes of FIG. 1B are not drawn to scale. One graph depicts displayed state of charge vs. battery capacity curve 122 and uses the vertical axis displayed state of charge 126 on the left side of FIG. 1B, while the other graph depicts battery voltage vs. battery capacity curve 124 and uses the vertical axis battery voltage 128 on the right side of FIG. 1B.

As described above, during operation of portable electronic device 100, as power is drained from battery 102, the state of charge determined by battery gas gauge 112 minus the predetermined reserve capacity is reported by BMU 104 to system 106 for display to a user. This is depicted by displayed state of charge vs. battery capacity curve 122. As portable electronic device 100 continues to draw power from battery 102, the state of charge of battery 102 monitored by battery gas gauge 112 will continue to fall until it is equal to the predetermined reserve capacity. Note that in the embodiments depicted in FIG. 1B, system 106 does not display a state of charge of battery 102 to the user that is less than a minimal state of charge (e.g., 1% in this embodiment). In other embodiments, the minimal state of charge is displayed until the portable electronic device begins to enter a low power usage state.

When battery gas gauge 112 determines that the state of charge of battery 102 has decreased to a level that is equal to the predetermined reserve capacity, BMU 104 continues reporting to system 106 that the state of charge of battery 102 is 1%. BMU 104 then monitors the voltage of battery 102 as depicted in battery voltage vs. battery capacity curve 124. As portable electronic device 100 continues to drain power from battery 102, the voltage of battery 102 drops until it reaches termination voltage 134. When this occurs, BMU 104 communicates to system 106 through communication link 110 a shutdown signal that causes portable electronic device 100 to go into a state that stops further power from being drawn from battery 102. Note that, for convenience, termination voltage 134 on the right axis battery voltage 128 is depicted as lining up with 0% on the displayed state of charge 126 axis.

In this embodiment, the state of charge of battery 102 between when the voltage of battery 102 reaches the termination voltage and when battery gas gauge 112 determines the state of charge of battery 102 to be equal to the predetermined reserve capacity (e.g., 0% on the axis displayed state of charge 126) is represented by reserve state of charge 132 and is available for use by portable electronic device 100.

Figure 2:
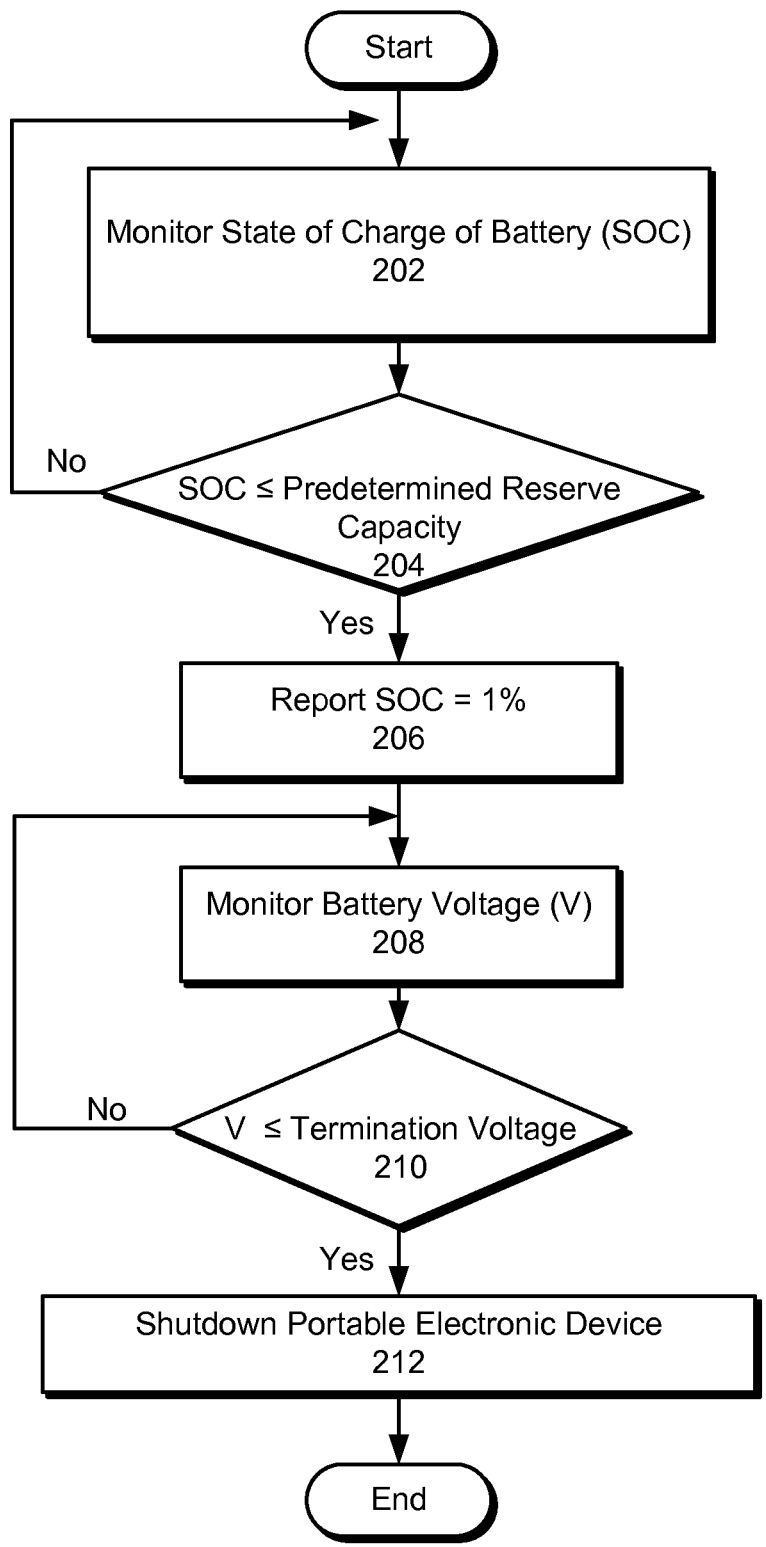
FIG. 2 shows a flowchart illustrating the process of monitoring a battery in a portable electronic device in accordance with an embodiment.

FIG. 2 shows a flowchart illustrating the process of monitoring a battery in a portable electronic device in accordance with an embodiment. First, the state of charge (SOC) of a battery in a portable electronic device is monitored (step 202). Then, if the SOC is not less than or equal to the predetermined reserve capacity (step 204), the process returns to step 202. If the SOC is less than or equal to the predetermined reserve capacity (step 204), then the process reports that the SOC equals 1% (step 206). The battery voltage is monitored (step 208), and if it is not less than or equal to the termination voltage (step 210), then the process returns to step 208. If the monitored voltage of the battery is less than or equal to the termination voltage (step 210), then the portable electronic device is shut down (step 212).

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for monitoring a battery in a portable electronic device, comprising:
   while monitoring a state of charge of the battery while the battery is powering the portable electronic device:
   if the state of charge is found to be above a predetermined reserve capacity, continuing to monitor the state of charge;
   if the state of charge is found to be equal to or less than the predetermined reserve capacity, switching from monitoring the state of charge to monitoring a voltage of the battery;
   while monitoring the voltage while the battery is powering the portable electronic device:
   if the monitored voltage is equal to or less than a predetermined termination voltage:
   if the monitored voltage meets a first criteria, performing at least one action that reduces a power drawn by the portable electronic device from the battery while keeping the portable electronic device running, the first criteria comprising whether a frequency of transient voltage dips below the predetermined termination voltage exceeds a predetermined frequency of transient voltage dips below the predetermined termination voltage;
   if the monitored voltage meets a second criteria, putting the portable electronic device into one of a shutdown state and a hibernate state, the second criteria comprising whether a steady-state voltage measurement of the monitored voltage is equal to or below the predetermined termination voltage;
   wherein the predetermined termination voltage is above the portable electronic device's brownout voltage.

2. The method of claim 1, wherein monitoring the state of charge of the battery involves using a battery gas gauge to monitor the state of charge of the battery.

3. The method of claim 1, wherein when the state of charge of the battery reaches the predetermined reserve capacity, the method additionally comprises displaying a minimal state of charge value to a user of the portable electronic device.

4. The method of claim 3, wherein the minimal state of charge value is a 1% state of charge.

5. The method of claim 1, wherein the predetermined reserve capacity is between a 2% state of charge of the battery and a 4% state of charge of the battery.

6. The method of claim 1, wherein the portable computing device includes at least one of: a smartphone, a tablet computer, and a laptop computer.

7. A system for monitoring a battery in a portable electronic device, comprising:
   a state of charge monitoring mechanism coupled to the battery and configured to:
   while monitoring a state of charge of the battery while the battery is powering the portable electronic device:
   if the state of charge is found to be above a predetermined reserve capacity, continue to monitor the state of charge;
   if the state of charge is found to be equal to or less than the predetermined reserve capacity, switch from monitoring the state of charge to monitoring a voltage of the battery;
   a voltage monitoring mechanism coupled to the battery and the state of charge monitoring mechanism, and configured to monitor the voltage in event the state of charge is found to be equal to or less than the predetermined reserve capacity;

a battery usage control mechanism coupled to the battery and the voltage monitoring mechanism, and configured to:

if the monitored voltage is equal to or less than a predetermined termination voltage:

if the monitored voltage meets a first criteria, perform at least one action that reduces a power drawn by the portable electronic device from the battery while keeping the portable electronic device running, the first criteria comprising whether a frequency of transient voltage dips below the predetermined termination voltage exceeds a predetermined frequency of transient voltage dips below the predetermined termination voltage;

if the monitored voltage meets a second criteria, put the portable electronic device into one of a shutdown state and a hibernate state, the second criteria comprising whether a steady-state voltage measurement of the monitored voltage is equal to or below the predetermined termination voltage;

wherein the predetermined termination voltage is above the portable electronic device's brownout voltage.

8. The system of claim 7, wherein the state of charge monitoring mechanism includes a battery gas gauge configured to monitor the state of charge of the battery.

9. The system of claim 8, further including a minimal state of charge display coupled to the state of charge monitoring mechanism and configured to display a minimal state of charge value to a user of the portable electronic device when the state of charge monitored by the state of charge monitoring mechanism reaches the predetermined reserve capacity.

10. The system of claim 9, wherein the minimal state of charge value is a 1% state of charge.

11. The system of claim 7, wherein the predetermined reserve capacity is between a 2% state of charge of the battery and a 4% state of charge of the battery.

12. The system of claim 7, wherein the portable computing device includes at least one of: a smartphone, a tablet computer, and a laptop computer.

13. A non-transitory computer-readable storage medium storing instructions that when executed by a computer cause the computer to perform a method for monitoring a battery in a portable electronic device, comprising:

while monitoring a state of charge of the battery while the battery is powering the portable electronic device:

if the state of charge is found to be above a predetermined reserve capacity, continuing to monitor the state of charge;

if the state of charge is found to be equal to or less than the predetermined reserve capacity, switching from monitoring the state of charge to monitoring a voltage of the battery;

while monitoring the voltage while the battery is powering the portable electronic device:

if the monitored voltage is equal to or less than a predetermined termination voltage:

if the monitored voltage meets a first criteria, performing at least one action that reduces a power drawn by the portable electronic device from the battery while keeping the portable electronic device running, the first criteria comprising whether a frequency of transient voltage dips below the predetermined termination voltage in the monitored voltage exceeds a predetermined frequency of transient voltage dips below the predetermined termination voltage;

if the monitored voltage meets a second criteria, putting the portable electronic device into one of a shutdown state and a hibernate state, the second criteria comprising whether a steady-state voltage measurement of the monitored voltage is equal to or below the predetermined termination voltage;

wherein the predetermined termination voltage is above the portable electronic device's brownout voltage.

14. The non-transitory computer-readable storage medium of claim 13, wherein monitoring the state of charge of the battery involves using a battery gas gauge to monitor the state of charge of the battery.

15. The non-transitory computer-readable storage medium of claim 13, wherein when the state of charge of the battery reaches the predetermined reserve capacity, the method additionally comprises displaying a minimal state of charge value to a user of the portable electronic device.

16. The non-transitory computer-readable storage medium of claim 15, wherein the minimal state of charge value is a 1% state of charge.

17. The non-transitory computer-readable storage medium of claim 13, wherein the predetermined reserve capacity is between a 2% state of charge of the battery and a 4% state of charge of the battery.

18. The method of claim 1, wherein the at least one action that reduces the power drawn by the portable electronic device from the battery includes one or more of: reducing a screen brightness, reducing a speaker volume, and shutting down a radio transceiver.

\* \* \* \* \*